United States Patent
Liang et al.

(10) Patent No.: US 7,241,691 B2
(45) Date of Patent: Jul. 10, 2007

(54) CONDUCTING METAL OXIDE WITH ADDITIVE AS P-MOS DEVICE ELECTRODE

(75) Inventors: Yong Liang, Gilbert, AZ (US); Clarence J. Tracy, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 249 days.

(21) Appl. No.: 11/092,469

(22) Filed: Mar. 28, 2005

(65) Prior Publication Data
US 2006/0216934 A1 Sep. 28, 2006

(51) Int. Cl.
*H01L 21/44* (2006.01)

(52) U.S. Cl. ............... 438/685; 438/678; 438/689; 257/E21.273; 257/E21.009

(58) Field of Classification Search ......... 438/685; 257/E21.273
See application file for complete search history.

(56) References Cited

U.S. PATENT DOCUMENTS

| | | | | |
|---|---|---|---|---|
| 4,348,268 | A * | 9/1982 | Muller | 204/290.13 |
| 6,323,511 | B1 * | 11/2001 | Marsh | 257/295 |
| 6,395,409 | B2 * | 5/2002 | Ueda et al. | 428/690 |
| 6,413,687 | B1 * | 7/2002 | Hattori et al. | 430/10 |
| 6,468,676 | B1 * | 10/2002 | Ueda et al. | 428/690 |
| 6,835,662 | B1 * | 12/2004 | Erhardt et al. | 438/689 |
| 2003/0136998 | A1 * | 7/2003 | Baniecki et al. | 257/310 |
| 2003/0143825 | A1 | 7/2003 | Matsuo et al. | |
| 2004/0248394 | A1 * | 12/2004 | Kobayashi et al. | 438/609 |
| 2005/0098205 | A1 * | 5/2005 | Rocheisen et al. | 136/263 |

OTHER PUBLICATIONS

Misra et al., "Issues in high-k gate stack interfaces," MRS Bulletin, Mar. 2002, www.mrs.org/publications/bulletin, pp. 212-216.
Anwar et al., "An XPS study of amorphous $MoO_3/SiO$ films deposited by co-evaporation," Journal of Materials Science 25 (1990) 1784-1788.

* cited by examiner

*Primary Examiner*—William B. Baumeister
*Assistant Examiner*—Igwe U. Anya
(74) *Attorney, Agent, or Firm*—Ingrassia Fisher & Lorenz

(57) ABSTRACT

Methods for fabricating high work function p-MOS device metal electrodes are provided. In one embodiment, a method is provided for producing a metal electrode including the steps of: providing a high k dielectric stack with an exposed surface; contacting the exposed surface of the high k dielectric stack with a vapor of a metal oxide wherein the metal oxide is selected from the group consisting of $RuO_x$, $IrO_x$, $ReO_x$, $MoO_x$, $WO_x$, $VO_x$, and $PdO_x$; and contacting the exposed surface of the dielectric stack with a vapor of an additive selected from the group consisting of $SiO_2$, $Al_2O_3$, $HfO_2$, $ZrO_2$, $MgO$, $SrO$, $BaO$, $Y_2O_3$, $La_2O_3$, and $TiO_2$, whereby contacting the exposed surface of the dielectric stack with the vapor of the metal oxide and the vapor of the additive forms an electrode and wherein the additive is present at an amount between about 1% to about 50% by atomic weight percent in the electrode.

12 Claims, 4 Drawing Sheets

CONDUCTING METAL OXIDE WITH ADDITIVE AS P-MOS DEVICE ELECTRODE

FIELD OF THE INVENTION

The present invention relates to high k dielectric devices. More particularly the invention relates to CMOS devices with high k dielectric gate stacks and metal electrodes used therewith.

BACKGROUND OF THE INVENTION

Designers, following Moore's law, continue in their attempts to shrink the size of transistors. As transistors become smaller and smaller, gate dielectric layers have also become thinner and thinner. The continued decrease in the thickness of gate dielectric layers is leading to technical problems. Leakage through a silicon dioxide dielectric layer of a gate increases exponentially as its thickness decreases. Gate dimensions that are proposed for the future will require dielectric layers that are so thin they may stray from purely "on" and "off" states. Instead, leakage may lead to a low power, or "leaky", off state. This challenge must be addressed for the success of future transistor generations.

One alternative that is being proposed is to use high k materials in place of silicon dioxide as the gate dielectric layer. High k refers to a high dielectric constant, a measure of the ability of a material to resist the formation of an electric field within it. Differing materials possess differing dielectric constants. High k materials include compounds of oxygen such as hafnium dioxide ($HfO_2$), zirconium dioxide ($ZrO_2$), and titanium dioxide ($TiO_2$), among others, and possess a dielectric constant above 3.9, the value of silicon dioxide.

However, the use of materials other than silicon dioxide as a dielectric material affects other components in the transistor structure. For example, electrodes have commonly been fabricated of doped polysilicon for use with silicon dioxide dielectric stacks. However, it has been found that doped polysilicon does not perform well with high k dielectric materials. When matched, for example, with a hafnium dioxide material in the gate dielectric stack, a doped polysilicon electrode suffers from a poor work function.

It has thus been proposed to use materials other than doped polysilicon for use as a gate electrode with high k dielectric materials. One such class of materials proposed for use as an electrode are conducting metal oxides. However, the use of conducting metal oxide as an electrode material presents several new challenges. First, the selected material must demonstrate stability over a range of temperatures. Virtually all the existing conducting metal oxides have been found inadequate for use as an electrode in combination with high k dielectrics because they have degraded with anneals. Conducting metal oxide materials have tended to dissociate, sublime, and degrade at high temperatures. This can result in changes in their electrical characteristics or the structure of the dielectric films underneath them which leads to a failure of electrical performance of the device. Additionally, a conducting useful metal oxide material must provide an acceptable work function. However, the desired work function can vary depending on whether a p-MOS device electrode or n-MOS device electrode is desired. The former generally need a high work function value, and the latter a low work function value.

Accordingly, it is desirable to identify new materials and methods of applying these materials for use as p-MOS device electrodes with high k dielectric layers. The desired process and materials should provide an effective high work function in conjunction with high k materials in gate dielectric layers. It is also desired to develop a p-MOS device electrode which performs well over a range of temperatures. In addition, it is desirable to develop these materials and methods so that they are suitable for use with current processing techniques used in integrated circuit fabrication. The present invention addresses one or more of these needs. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements, and wherein.

DETAILED DESCRIPTION OF A PREFERRED EMBODIMENT

The following detailed description of the invention is merely exemplary in nature and is not intended to limit the invention or the application and uses of the invention. Furthermore, there is no intention to be bound by any theory presented in the preceding background of the invention or the following detailed description of the invention.

It has now been conceived to form an electrode for use with a high k dielectric gate stack wherein the electrode comprises a conducting metal oxide and an additive material (sometimes referred to as a dopant material) combined with the metal oxide. It is preferred that the electrode comprises a gate electrode in p-MOS device electrode applications. In a preferred embodiment, suitable conducting metal oxides include, but are not limited to, the group $RuO_x$, $IrO_x$, $ReO_x$, $MoO_x$, $WO_x$, $VO_x$, and $PdO_x$. It will be recognized by those skilled in the art that the conducting metal oxides have been represented in formulas that allow for variable stoichiometry of elements. X may be a fractional real number, and the value of x in the different compounds may vary. The additive that may be used in combination with the metal oxide is preferably chosen from, but is not limited to, the group of $SiO_2$, $Al_2O_3$, $HfO_2$, $ZrO_2$, $MgO$, $SrO$, $BaO$, $Y_2O_3$, $La_2O_3$, and $TiO_2$. It is also preferred that the additive be present at an amount of between about 1% to about 50% by atomic percent in combination with the metal oxide. More preferably, the additive is present with the metal oxide at an amount of between about 5% to about 20% by atomic percent.

Figure 1:
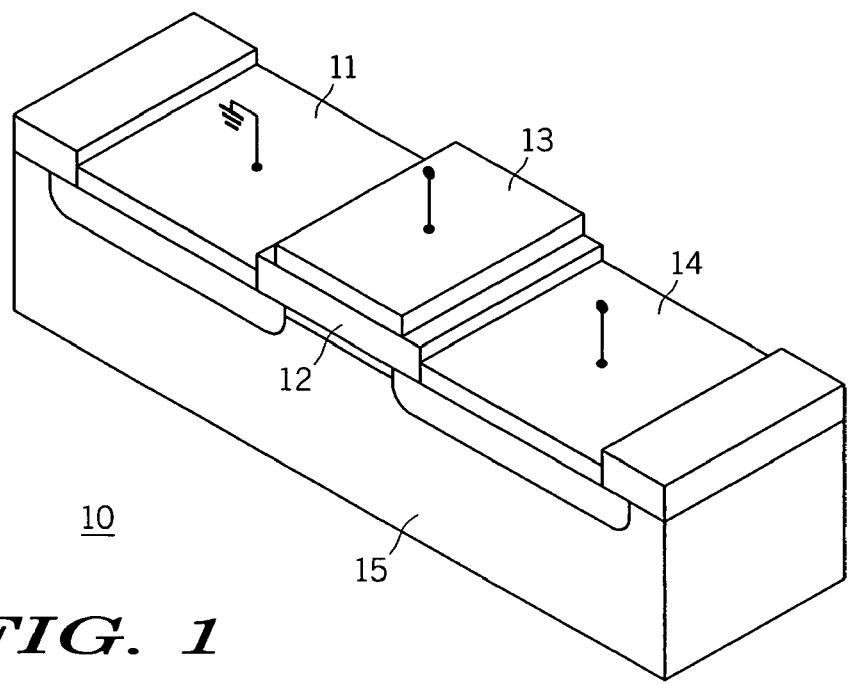
FIG. 1 is an illustration of the MOS type structure that may be fabricated with a p-MOS device electrode according to an embodiment of the present invention.

Referring now to FIG. 1 there is shown an illustration of a MOS type structure that may be fabricated according to an embodiment of the present invention. The MOS transistor 10 includes source 11, dielectric stack 12, gate electrode 13, and drain 14. An underlying base layer 15 is also included in the structure. Gate electrode 13 comprises the conducting metal oxide and additive as previously described. It will be understood by those knowledgeable in the art that other structures may also be present in the basic MOS structure. An MOS type structure typically includes a gate contact energized to create an electric field within a semiconductor channel, which allows current to conduct between source and drain regions.

Dielectric stack 12 is shown as a single layer; however, it may include more than one material and/or layer of materials that functions as a dielectric stack. Dielectric stack 12 is preferably a high k dielectric stack; and the electrode of this disclosure is designed for application with high k dielectric materials. Moreover dielectric stack 12 preferably comprises $HfO_2$ or $ZrO_2$. As used herein the term "high k" or "high k dielectric material" means a dielectric material having a k value above about 3.9. Such high k dielectric materials include, for example, hafnium oxides, zirconium oxides, titanium oxides, aluminum oxides and others. In general high k dielectric materials encompass those materials that are binary, ternary and higher oxides and any ferroelectric materials having a k value of about 20 or more. Further the high k dielectric materials include composite materials such as hafnium silicate, other silicates, hafnium silicon oxynitride, and other oxynitrides. Production of dielectric stack 12 produces an exposed surface onto which is formed electrode 13.

Base layer 15 may comprise a silicon layer. In such an embodiment, base layer 15 is a silicon substrate as used in the manufacture of silicon-based semiconductors. Alternatively base layer 15 may comprise a silicon-on-insulator material (SOI). Acceptable methods of developing the semiconductor structure shown in FIG. 1 typically begin with the preparation of base layer 15. This can be achieved through any of the known procedures used in the semiconductor art. The substrate may also include dopants such as p-doping. The development of the base layer 15 will render an exposed surface of the substrate onto which further layers of material, in this case, the high k dielectric stack 12 will be deposited.

The electrode 13 comprises the material of conducting metal oxide with additive. Moreover, the conducting metal oxide and additive combination remains substantially stable at temperatures up to approximately 1000° C. While not wishing to be bound by any theory, it is believed that the use of additive materials strengthens bonding between the metal and oxygen. Thus, the use of additive minimizes degradation previously displayed by conducting metal oxides at elevated temperatures.

Figure 2:
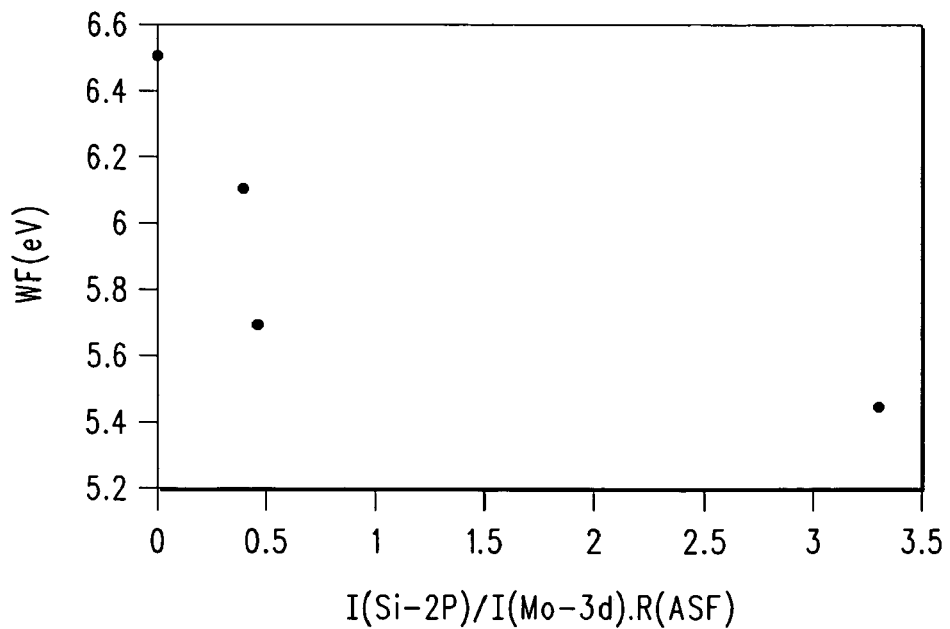
FIG. 2 is a plot of vacuum work function data as a function of $SiO_2$ additive concentration showing the effect of additive on work function, according to an embodiment of the present invention.

Further, the use of the conducting metal oxide and additive described herein provides an electrode/dielectric combination with a high work function. Referring now to FIG. 2 there is shown a plot of work function data as a function of additive addition. Along the x-axis, additive is shown as the ratio of additive to conducting metal oxide. In FIG. 2, $SiO_2$ has been combined with $MoO_x$. FIG. 2 thus shows the effect of adding $SiO_2$ on the vacuum work function of $MoSi_xO_y$. The data indicate that as the amount of $SiO_2$ additive increases, the vacuum work function decreases from 6.5 eV to approximately 5.4 eV. In combination with a desired high k dielectric, the gate electrode can thus be created with a work function that is suitable for p-MOS device electrode applications in CMOS type devices.

Figure 3:
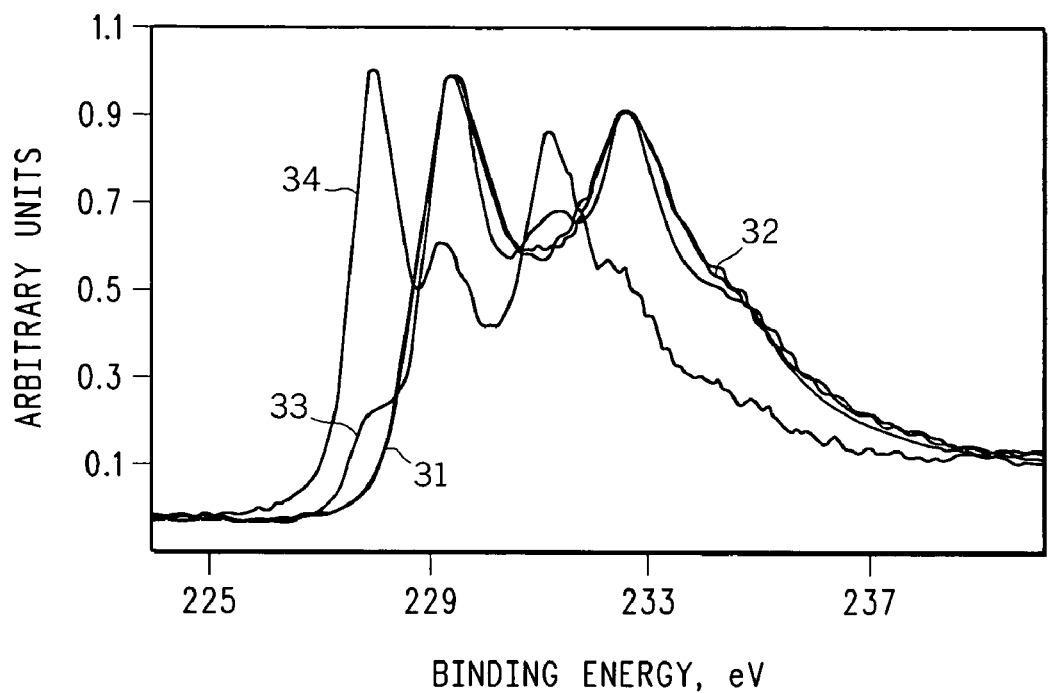
FIG. 3 is a plot of XPS Mo-3d core level spectra, in arbitrary units, as a function of binding energy of undoped $MoO_x$ annealed at varying temperatures.
Figure 4:
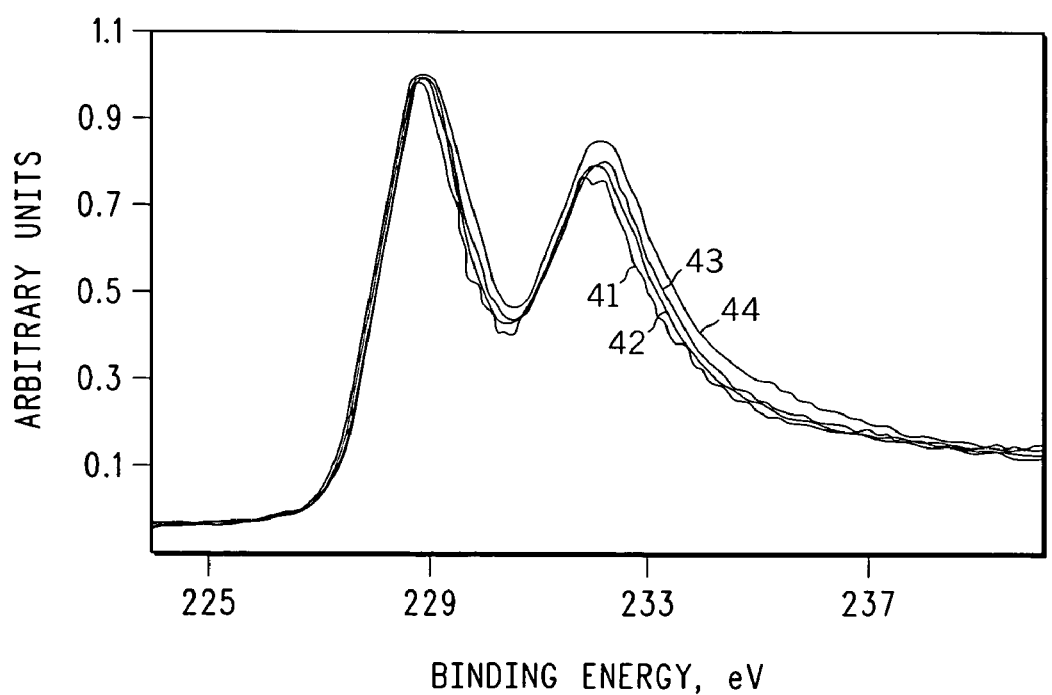
FIG. 4 is a plot of XPS Mo-3d core level spectra, in arbitrary units, as a function of binding energy of $MoO_x$ with $SiO_2$ additive annealed at varying temperatures.

Additionally, embodiments of the electrode have demonstrated stability through the temperature ranges desired for CMOS applications. FIGS. 3 and 4 show contrasting plots of XPS core level spectra for undoped and doped $MoO_x$ annealed at various temperatures. XPS Mo-3d core level spectra, a measure of intensity, are presented in arbitrary units. In FIG. 3, the changing plot of the spectra represents physical changes in the undoped $MoO_x$ at various temperatures. Thus, for example, curve 31 corresponds to the originally deposited $MoO_x$. Curve 32 represents the spectra of the undoped $MoO_x$ annealed at a temperature of 530° C. Curve 33 represents the spectra of the undoped $MoO_x$ annealed at a temperature of 730° C.; and curve 34 represents the spectra of the undoped $MoO_x$ annealed at 850° C. It is noted that the spectra do not overlap, and thus the data indicate that undoped $MoO_x$ is not stable at increasing temperature; rather the material is changing in physical make up as the temperature increases. Moreover, the spectral curves that have changed from the original $MoO_x$ material correspond to various structures of $Mo^0$, $Mo^{4+}$, and $Mo^{6+}$, further evidence of the structural degradation of $MoO_x$ at the changing temperatures.

In contrast, FIG. 4 illustrates data of the kind from FIG. 3, again annealed at increasing temperatures; however this time the data is from a doped $MoO_x$. In this case the material was $MoO_x$ with an $SiO_2$ additive, resulting in an as deposited $MoSi_xO_y$ material. In FIG. 4, curve 41 represents spectra of annealing at a temperature of 900° C.; curve 42 at 800° C.; curve 43 at 600° C., and curve 44 as deposited. In this figure, each spectral curve overlaps the spectral curve from the original material. The curves do not diverge as do those of FIG. 3. Thus, at increasing temperature points, similar to the temperature range as tested in FIG. 3, the composition and chemical states remain the same. FIG. 4 indicates that a $MoO_x$ with additive material maintains its chemical and compositional integrity over a desired temperature range.

Figure 5:
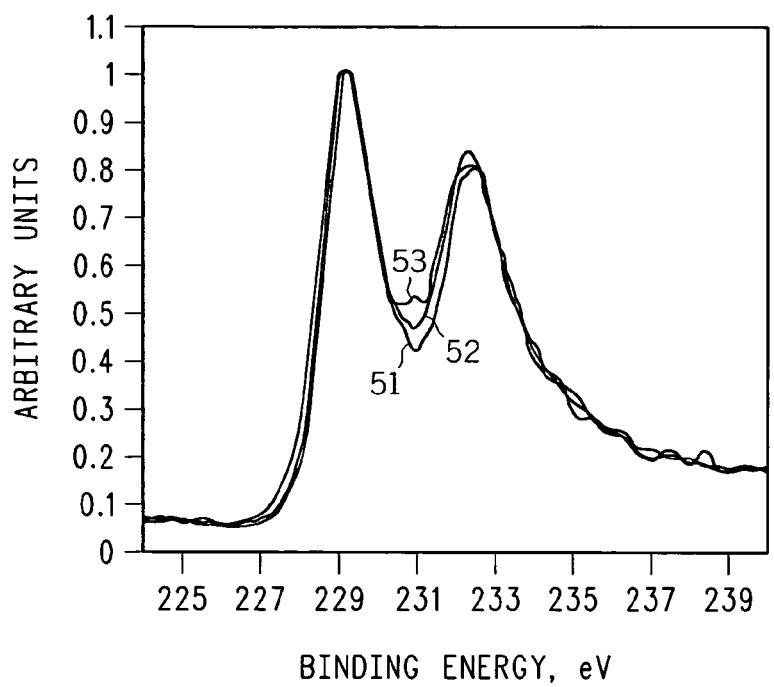
FIG. 5 is a plot of XPS Mo-3d core level spectra, in arbitrary units, as a function of binding energy of $MoO_x$ with $HfO_2$ additive annealed at varying temperatures.

A similar behavior has also been observed in $MoO_x$ combined with $HfO_2$ additive. FIG. 5 illustrates a plot, in the same nature as FIG. 4, for an $MoO_x$ combined with an $HfO_2$ additive. In contrast with the pure $MoO_x$ material of FIG. 3, which shows degradation at elevated temperatures, $MoO_x$ doped with $HfO_2$ displays a much improved stability. The data curves in FIG. 5 are the spectra of the as deposited material (curve 53), the material annealed at 800° C. (curve 52), and the material annealed at 900° C. (curve 51). It is noted that, as with FIG. 4, the curves in FIG. 5 generally overlap. Thus, an $MoO_x/HfO_2$ material also provides structural integrity over a desired temperature range.

With respect to FIG. 2, it was earlier noted that the addition of additive material to a conducting metal oxide provides a material with an acceptably high work function for CMOS applications. A further conclusion from this data is that the amount of additive that is present in the conducting metal oxide is also a variable that may be controlled. The combination or relatively more or less additive can be controlled so as to produce a desired work function. The work function may thus be tuned by the amount of additive present in the conducting metal oxide. FIG. 2 indicates a tuning affect in that the vacuum work function (y-axis) varies depending on the amount of additive present (x-axis).

Figure 6:
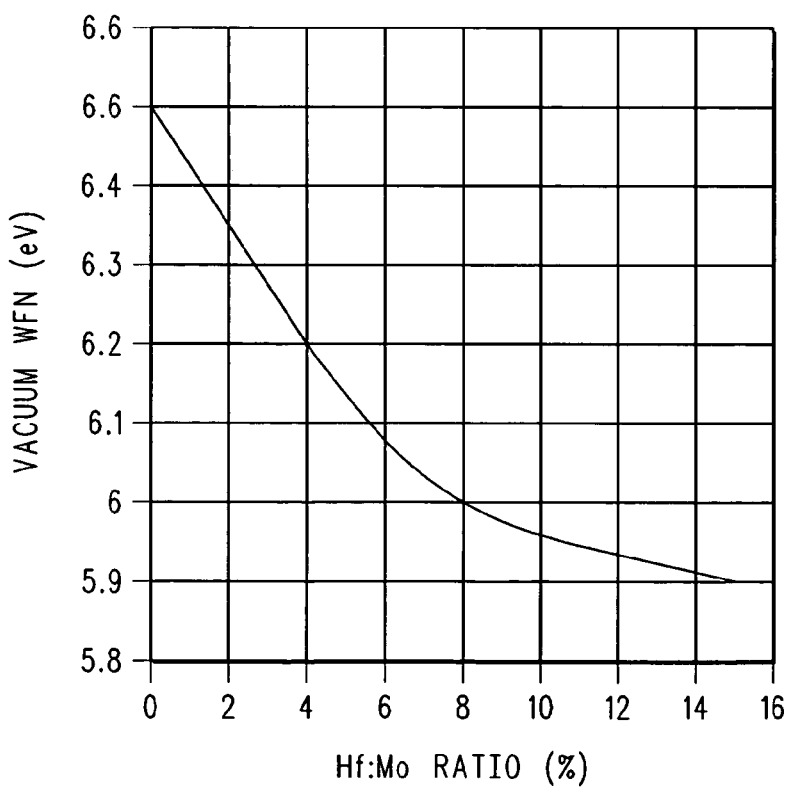
FIG. 6 is a plot of vacuum work function data as a function of $HfO_2$ additive concentration showing the effect of additive on work function, according to an embodiment of the present invention.

A similar trend was also observed in $HfO_2$ doped $MoO_x$. Referring now to FIG. 6, there is shown a plot of work function data as a function of additive. In FIG. 6 the x-axis is the ratio between Hf and Mo for an $HfO_2$ additive in $MoO_x$. In FIG. 6 the vacuum work function varies with the concentration of additive thus showing the tuneable relationship. Hence, the formation of electrodes comprising conducting metal oxide and additive, according to the embodiments of the present invention, allow a designer flexibility in choosing a work function target.

Metal electrodes of the conducting metal oxide/additive combination can be formed by ebeam evaporation. However, other techniques, including other physical vapor deposition and chemical vapor deposition techniques, may also be used to deposit and/or form the electrode. Acceptable PVD techniques include sputtering and pulsed laser deposition. The sputtering technique includes reactive sputtering, co-sputtering, or single target sputtering pre-mixed compositions. Acceptable CVD techniques include Metal Organic Chemical Vapor Deposition (MOCVD) and Atomic Layer Deposition (ALD). With respect to ebeam evaporation, in one embodiment the technique uses multiple sources for use in the process. In this embodiment, one source is provided for the native metal and a separate source is provided for the additive. The deposition is conducted in the presence of an oxidant such as molecular oxygen so that the host metal oxide doped with additive is formed. Experimental techniques, for example, have followed this procedure. Vapor fluxes from each source (the host metal and the additive) were combined in the presence of oxygen so as to create one deposited film. Other techniques can combine both the host metal oxide and additive into a single ingot or single source so that the processing technique uses a single source. Ebeam evaporation is a generally good technique for providing even coatings on sample surfaces. Ebeam techniques are also useful in that the technique provides little coating on side surfaces. The formation of metal electrodes is thus also compatible with integrated circuit fabrication techniques.

In one embodiment a method of forming a semiconductor electrode includes steps of producing a high k dielectric stack that has an exposed surface. The exposed surface, where it is desired to build the electrode, is then exposed to vapor of the metal of the host metal oxide, vapor of the additive, and vapor of oxidant such as molecular oxygen. In this way there is a contact between the exposed surface and the vapors such that the electrode is formed/deposited. As is known in the art control variables such as times, temperatures, oxygen pressure, and ebeam intensities are varied so as to obtain the desired electrode build up. Thus, for example, ebeam intensity on an additive source can be controlled so that an electrode with a desired concentration of additive is formed.

Oxygen pressure can also be controlled so that desired chemical properties of the host metal oxide can be achieved. Preferably, the pressure of molecular oxygen is between $10^{-5}$ Torr to $10^{-7}$ Torr for forming $MoSi_xO_y$ and $MoHf_xO_y$ and, more preferably, the pressure of molecular oxygen is approximately at $10^{-6}$ Torr so that Mo with the desired 4+ chemical state is formed.

Temperature is another variable that can be controlled to form desired electrode on a high-k dielectric. Preferably, the wafer temperature ranges from room temperature to 800° C. and, more preferably, the wafer temperature ranges from 200° C. to 500° C.

In accordance with another embodiment of the present invention, a method of forming a semiconductor electrode includes steps of producing a high k dielectric stack that has an exposed surface. The exposed surface, where it is desired to build the electrode, is then exposed to vapors of metal oxide and the additive. In this method there is a contact between the exposed surface and the vapors such that the electrode is formed/deposited. As is known in the art control variables such as times, temperatures, and ebeam intensities are varied so as to obtain the desired electrode build up. Thus, for example, ebeam intensity on an additive source can be controlled so that an electrode with a desired concentration of additive is formed.

Figure 7:
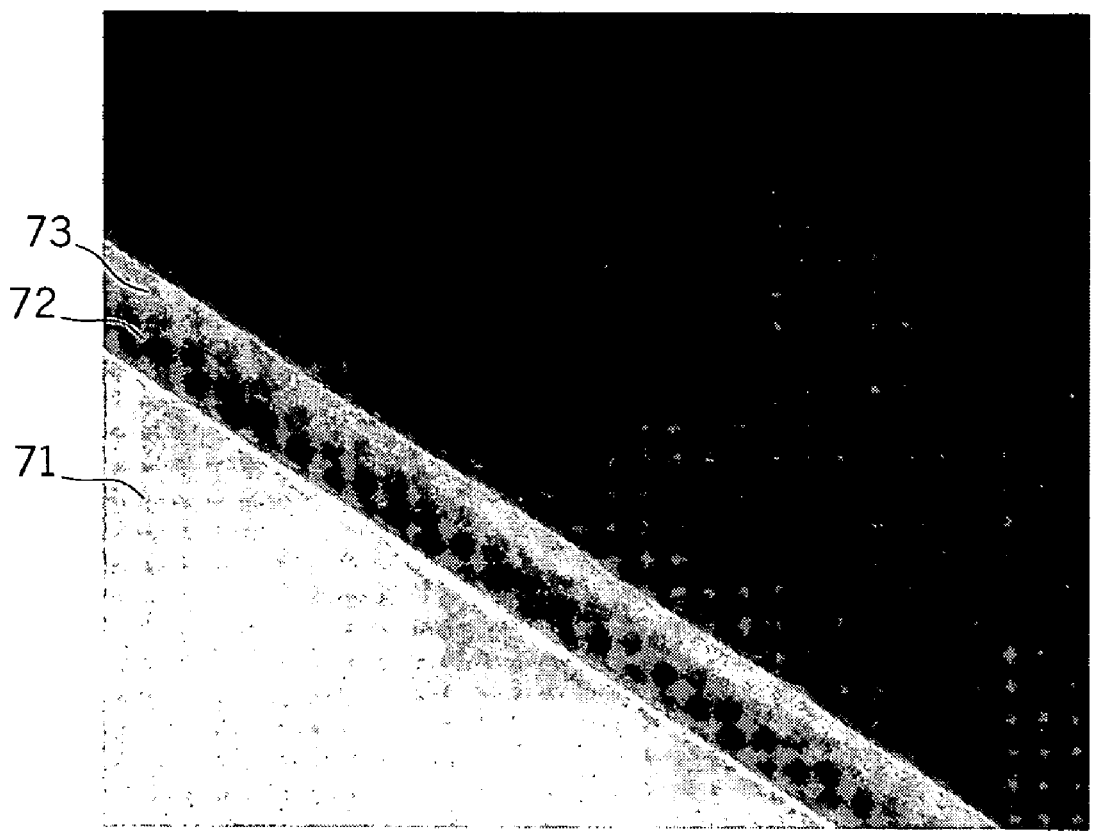
FIG. 7 is a micrograph of a metal oxide with additive gate electrode and high k dielectric stack structure according to an embodiment of the present invention.

In addition to the uniform mixture of host metal oxide and additive as presented in the foregoing exemplary embodiments, the additive can also be introduced into the host metal oxide through layering. This can be achieved by sequential deposition of host metal oxide and additive material during electrode formation/deposition. The thickness ratio of each host metal oxide layer and the additive layer should be close to the desired stoichiometry ratio of the host metal oxide and the additive. For example, for an $MoSi_xO_y$ having 90% of $MoO_x$ and 10% of $SiO_2$, the thickness ratio of $MoO_x$ and $SiO_2$ in the layered structure should be close to 9:1. This, for example, can be accomplished using PVD or ALD by alternating deposition of $MoO_x$ and $SiO_2$ such as depositing 1 Å of $SiO_2$ on every 9 Å of $MoO_x$. While selection of each thickness in this layered structure is less important as long as the ratio of the two thicknesses is close to the ratio of the stoichiometry, it is preferred that the thickness of the host metal oxide is sufficiently small so that the additives are within the close proximity of the host material A micrograph illustrating a sample of metal oxide/additive layer of material on a high k layer is shown in FIG. 7. This micrograph, showing a 20 nm resolution, illustrates a silicon base layer 71, an $HfO_2$ layer 72, and a $MoSi_xO_y$ layer 73. This material has been subjected to an annealing treatment at 450° C. in forming gas, typical of IC fabrication. FIG. 7 illustrates a clean and well-defined interface between the high k layer 72 and the electrode layer 73. No pin holes or other physical degradation is present in the electrode layer 73, as would be expected if only metal oxide were used for that layer.

When a material is referred to by a specific chemical name or formula, the material may include non-stoichiometric variations of the stoichiometrically exact formula identified by the chemical name. Thus, for example, hafnium dioxide may include both the stoichiometrically exact composition of formula $HfO_2$ as well as $Hf_xO_y$ in which either of x or y vary by some amount from 1 and 2 respectively.

In one embodiment, there is provided a method for forming a metal electrode comprising: providing a high k dielectric stack with an exposed surface; contacting the exposed surface of the high k dielectric stack with a vapor of a metal oxide wherein the metal oxide comprises a material selected from the group consisting of $RuO_x$, $IrO_y$, $ReO_z$, $MoO_a$, $WO_b$, $VO_x$, and $PdO_c$; where each of x, y, z, a, b, and c are real numbers; and contacting the exposed surface of the dielectric stack with a vapor of an additive selected from the group consisting of $SiO_2$, $Al_2O_3$, $HfO_2$, $ZrO_2$, MgO, SrO, BaO, $Y_2O_3$, $La_2O_3TiO_2$, whereby contacting the exposed surface of the dielectric stack with the vapor of the metal oxide and the vapor of the additive forms an electrode and wherein the additive is present at an amount between about 1% to about 50% by atomic percent in the electrode.

In a further embodiment, the method includes the step of contacting the exposed surface of the dielectric stack with a vapor of a metal oxide and the step of contacting the exposed surface of the dielectric stack with a vapor of an additive further comprises a physical vapor deposition selected from the group consisting of ebeam, sputtering, and pulsed laser deposition.

In a further embodiment, the step of contacting the exposed surface of the dielectric stack with a vapor of a metal oxide and the step of contacting the exposed surface of the dielectric stack with a vapor of an additive further comprises a physical vapor deposition selected from the group consisting of ebeam, sputtering, and pulsed laser deposition.

In a further embodiment the step of contacting the exposed surface of the dielectric stack with a vapor of a metal oxide and the step of contacting the exposed surface of the dielectric stack with a vapor of an additive further comprises forming an electrode having an additive present at an amount of between about 5% to about 20% by atomic percent.

In a further embodiment the step of contacting the exposed surface of the dielectric stack with a vapor of a metal oxide and the step of contacting the exposed surface of the dielectric stack with a vapor of an additive further comprises forming an electrode that remains substantially stable at temperatures up to approximately 1000° C.

In a further embodiment, the method further includes forming the electrode in a CMOS device.

In a further embodiment, the method includes forming the electrode as a p-MOS device electrode metal structure.

In a further embodiment, the method includes forming the electrode with a surface work function greater than approximately 5 eV.

In a further embodiment the electrode comprises a uniform mixture of host conducting metal oxide and additive made by PVD and MOCVD methods.

In a further embodiment, the method also includes forming the electrode as a gate electrode.

In an additional embodiment, there is provided a method of tuning the work function of an electrode comprising: providing a high k dielectric stack with an exposed surface; contacting the exposed surface of the high k dielectric stack with a vapor of a metal oxide wherein the metal oxide is selected from the group consisting of $RuO_x$, $IrO_x$, $ReO_x$, $MoO_x$, $WO_x$, $VO_x$, and $PdO_x$; contacting the exposed surface of the dielectric stack with a vapor of an additive selected from the group consisting of $SiO_2$, $Al_2O_3$, $HfO_2$, $ZrO_2$, MgO, SrO, BaO, $Y_2O_3$, $La_2O_3$, and $TiO_2$; maintaining contact between the exposed surface of the high k dielectric stack and the vapor of metal oxide and the vapor of additive so as to form an electrode wherein the additive is present at an amount between about 1% to about 50% by atomic percent in the electrode; and controlling the amount of additive present in the electrode so as to produce a desired work function.

In a further embodiment the step of controlling the amount of additive present further comprises controlling the amount of additive present in the electrode so as to produce a work function of at least 5 eV.

In a further embodiment, the method includes providing a high k dielectric stack with a set k value and a producing an electrode with a desired work function so that the combined dielectric stack and electrode have a electrical work function of between about 5.0 eV and about 5.4 eV.

In a further alternative embodiment, there is provided an electrode for use with a high k dielectric gate stack, the electrode comprising: a metal oxide, wherein the metal oxide comprises a material selected from the group consisting of $RuO_x$, $IrO_y$, $ReO_z$, $MoO_a$, $WO_b$, $VO_x$, and $PdO_c$; wherein x, y, z, a, b, and c are real numbers; and an additive disposed within the metal oxide wherein the additive is selected from the group consisting of $SiO_2$, $Al_2O_3$, $HfO_2$, $ZrO_2$, MgO, SrO, BaO, $Y_2O_3$, $La_2O_3$, and $TiO_2$; and wherein the additive present at an amount between about 1% to about 50% by atomic percent.

In a further embodiment the additive is present at an amount of between about 5% to about 20% by atomic percent.

In a further embodiment the metal oxide remains substantially stable at temperatures up to approximately 1000° C.

In a further embodiment the electrode is disposed in a CMOS device.

In a further embodiment the electrode comprises a p-MOS structure.

In a further embodiment the metal oxide and additive are combined so as to provide a surface work function greater than approximately 5 eV.

In a further embodiment the electrode comprises a layered structure of host conducting metal oxide and additive made by PVD and ALD methods.

In a further embodiment the electrode comprises a gate electrode.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method for forming a metal electrode comprising:
   providing a high k dielectric stack with an exposed surface;
   contacting the exposed surface of the high k dielectric stack with a vapor of a metal oxide wherein the metal oxide comprises a material selected from the group consisting of $RuO_x$, $IrO_y$, $ReO_z$, $MoO_a$, $WO_b$, $VO_x$, and $PdO_c$; where each of x, y, z, a, b, and c are real numbers; and
   contacting the exposed surface of the dielectric stack with a vapor of an additive selected from the group consisting of $SiO_2$, $Al_2O_3$, $HfO_2$, $ZrO_2$, MgO, SrO, BaO, $Y_2O_3$, $La_2O_3$, and $TiO_2$, whereby contacting the exposed surface of the dielectric stack with the vapor of the metal oxide and the vapor of the additive forms an electrode and wherein the additive is present at an amount between about 1% to about 50% by atomic percent in the electrode.

2. The method of claim 1 wherein contacting the exposed surface of the dielectric stack with a vapor of a metal oxide contacting the exposed surface of the dielectric stack with a vapor of an additive further comprises a physical vapor deposition selected from the group consisting of ebeam, sputtering, and pulsed laser deposition.

3. The method of claim 1 wherein contacting the exposed surface of the dielectric stack with a vapor of a metal oxide and contacting the exposed surface of the dielectric stack with a vapor of an additive further comprises forming an electrode having an additive present at an amount of between about 5% to about 20% by atomic percent.

4. The method according to claim 1 wherein contacting the exposed surface of the dielectric stack with a vapor of a metal oxide and contacting the exposed surface of the dielectric stack with a vapor of an additive further comprises forming an electrode that remains substantially stable at temperatures up to approximately 1000° C.

5. The method according to claim 1 further comprising forming the electrode in a CMOS device.

6. The method according to claim 1 further comprising forming the electrode as a p-MOS device electrode metal structure.

7. The method according to claim 1 further comprising forming the electrode with a surface work function greater than approximately 5 eV.

8. The electrode according to claim 1 wherein the electrode comprises a uniform mixture of host conducting metal oxide and additive made by PVD and MOCVD methods.

9. The method according to claim 1 further comprising forming the electrode as a gate electrode.

10. A method of tuning the work function of an electrode comprising:
providing a high k dielectric stack with an exposed surface;
contacting the exposed surface of the high k dielectric stack with a vapor of a metal oxide wherein the metal oxide is selected from the group consisting of $RuO_x$, $IrO_x$, $ReO_x$, $MoO_x$, $WO_x$, $VO_x$, and $PdO_x$;
contacting the exposed surface of the dielectric stack with a vapor of an additive selected from the group consisting of $SiO_2$, $Al_2O_3$, $HfO_2$, $ZrO_2$, MgO, SrO, BaO, $Y_2O_3$, $La_2O_3$, and $TiO_2$;
maintaining contact between the exposed surface of the high k dielectric stack and the vapor of metal oxide and the vapor of additive so as to form an electrode wherein the additive is present at an amount between about 1% to about 50% by atomic percent in the electrode; and
controlling the amount of additive present in the electrode so as to produce a desired work function.

11. The method according to claim 10 wherein controlling the amount of additive present further comprises controlling the amount of additive present in the electrode so as to produce a work function of at least 5 eV.

12. The method according to claim 10 further comprising providing a high k dielectric stack with a set k value and a producing an electrode with a desired work function so that the combined dielectric stack and electrode have a electrical work function of between about 5.0 eV and about 5.4 eV.

* * * * *